United States Patent [19]

Naster et al.

[11] 4,418,470
[45] Dec. 6, 1983

[54] METHOD FOR FABRICATING SILICON-ON-SAPPHIRE MONOLITHIC MICROWAVE INTEGRATED CIRCUITS

[75] Inventors: Ronald J. Naster, Syracuse; Simon A. Zaidel, Liverpool; Ying-Chen Hwang, Liverpool; Earl L. Parks, Liverpool; William R. Cady, Scotia, all of N.Y.

[73] Assignee: General Electric Company, Syracuse, N.Y.

[21] Appl. No.: 313,378

[22] Filed: Oct. 21, 1981

[51] Int. Cl.³ .................. H01L 29/80; H01L 27/02; H01L 29/04
[52] U.S. Cl. .............................. 29/577 C; 29/571; 29/576 B; 148/1.5; 148/187; 357/23; 357/49; 357/51
[58] Field of Search .............. 29/571, 576 B, 577 C; 148/1.5, 187; 357/4, 23 TF, 49, 51

[56] References Cited

U.S. PATENT DOCUMENTS

| | | | |
|---|---|---|---|
| 3,397,447 | 8/1968 | Currin et al. | 357/51 |
| 3,489,953 | 1/1970 | Thomas | 357/51 |
| 3,958,266 | 5/1976 | Athanas | 357/23 TF |
| 3,997,908 | 12/1976 | Schloeherer et al. | 357/23 TF |
| 4,002,501 | 1/1977 | Tamura | 148/1.5 |
| 4,072,974 | 2/1978 | Ipri | 357/23 TF |
| 4,183,134 | 1/1980 | Oehler et al. | 29/571 |
| 4,199,773 | 4/1980 | Goodman et al. | 357/4 |
| 4,242,156 | 12/1980 | Peel | 148/175 |
| 4,344,223 | 8/1982 | Bulger et al. | 29/577 C |

OTHER PUBLICATIONS

Naster, R. J. et al. "Silicon-on-Sapphire Monolithic Microwave ICs", 1981 *Digest of Technical Papers*, Feb. 18-20, 1981, IEEE Solid State Circuits Counsel, IEEE New York Sect., Univ. of Penn., pp. 72-73.

"Strategic and Tactical Radar Array Modules (STRAM)-Phase I", *Final Report*, Jan. 1981, prepared by Electronics Laboratory, General Electric Company, Syracuse, N.Y. for RADC, Griffis Air Force Base, Rome, N.Y. under Contract No. F30602-79-C-0159.

Nov. 1980 GOMAC-Naster, R. J. et al. "SOS Monolithic Microwave Integrated Circuits for Radar Applications", *1980 Digest of Papers*, pp. 291-294.

Lewis, E. T., et al. "SOS IGFETS and MESFETS for L and S Band Radar Applications", pp. 295-298, Nov. 1980 GOMAC.

Laighton, D., et al., "Silicon-on-Sapphire (SOS) Monolithic Transceiver Module Components for L- and S-Band", pp. 299-302, Nov. 1980 GOMAC.

*Primary Examiner*—Upendra Roy
*Attorney, Agent, or Firm*—Richard V. Lang; Carl W. Baker

[57] ABSTRACT

A fabrication technique for monolithic microwave integrated circuits employs silicon-on-sapphire wafers. Active and passive elements are formed together in a series of implant and deposition steps. Electrically isolated islands of semiconductor material are defined upon the substrate. Multiple metallization deposits are employed to simultaneously interconnect the individual circuit elements and form passive elements upon the integrated circuit. The technique allows mass production of integrated circuits with considerable raw material savings.

20 Claims, 16 Drawing Figures

METHOD FOR FABRICATING SILICON-ON-SAPPHIRE MONOLITHIC MICROWAVE INTEGRATED CIRCUITS

This invention was made in the course of or under Contract No. F30602-79C-0159 of the U.S. Air Force.

CROSS-REFERENCE TO RELATED PATENT APPLICATION

The invention disclosed herein is related to the disclosure of U.S. patent application Ser. No. 109,174, filed Jan. 2, 1980 by W. R. Cady et al and assigned to the instant assignee.

BACKGROUND OF THE INVENTION

1. Field of the Invention

This invention relates to monolithic microwave integrated circuits, and, more particularly, to a method of fabricating such circuits.

2. Description of the Prior Art

Prior art attempts to manufacture monolithic microwave integrated circuits have met with limited success due to the high electrical loss, high interelemental parasitic capacitances, which leads to inadequate isolation of elements, and high conductor-to-substrate capacitances associated with bulk silicon.

U.S. patent application Ser. No. 109,174, discloses one successful technique for the production of active devices using silicon-on-sapphire material. The silicon layer overlying the sapphire is etched to form islands, and active devices are formed within the islands. Metallization layers for contacts and electrical interconnections are then applied.

SUMMARY OF THE INVENTION

An object of the present invention is to provide a monolithic microwave integrated circuit which can be mass produced and which provides good isolation of elements and reduced parasitic capacitances between elements disposed on a chip.

A more specific object of the present invention is to extend the technique disclosed by Cady et al in the above cited U.S. patent application, Ser. No. 109,174 to provide a technique for the manufacture of monolithic microwave integrated circuits using silicon-on-sapphire technology using completely lumped component passive circuitry and one micron gate length depletion-mode metal semiconductor field effect transistors in which active and passive circuit elements are formed simultaneously.

Accordingly, this invention discloses a method of fabricating monolithic microwave integrated circuits which uses epitaxial grown silicon-on-sapphire substrates. Active and passive semiconductor elements are formed within the layer of silicon. Portions of the silicon layer are removed to isolate each of the active and passive elements into electrically isolated components. Additional layers of material are deposited to form specific elements upon the isolated regions of silicon, and layers of metallization are deposited on the regions of silicon to form inductive elements and electrical contacts to the semiconductor material.

BRIEF DESCRIPTION OF THE DRAWINGS

Features of the invention believed to be novel and unobvious over the prior art are set forth with particularity in the appended claims. The invention itself, however, as to organization, method of operation and best mode contemplated, together with further objects and advantages may best be understood by reference to the following description taken in conjunction with the accompanying drawings in which like reference characters refer to like elements throughout, and in which:

DESCRIPTION OF PREFERRED EMBODIMENTS

Figure 1:
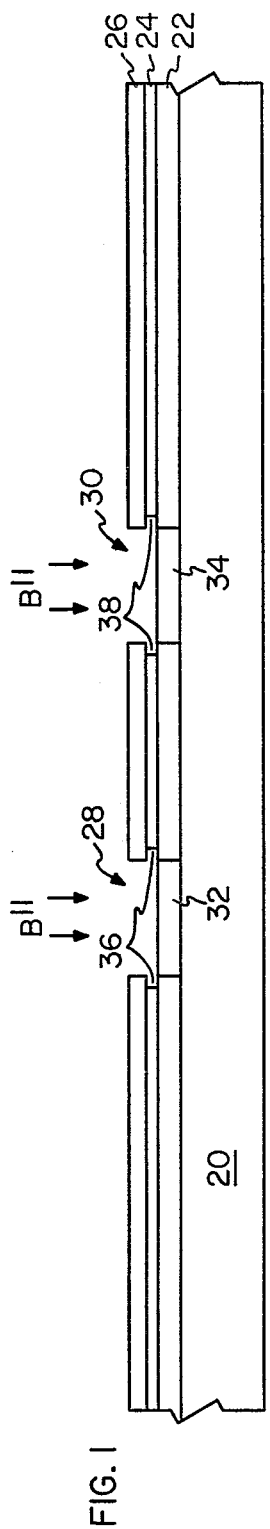
FIGS. 1—12 are schematic, partial cross-sectional views illustrating in sequence the fabrication steps of the present invention.
Figure 2:
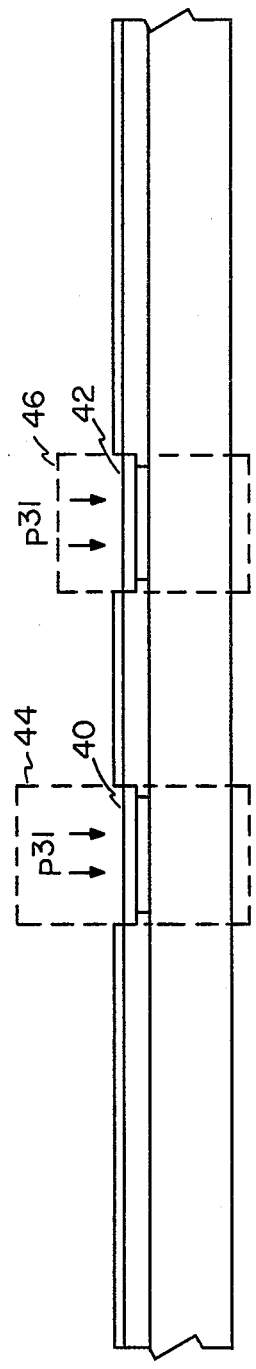
Figure 3:
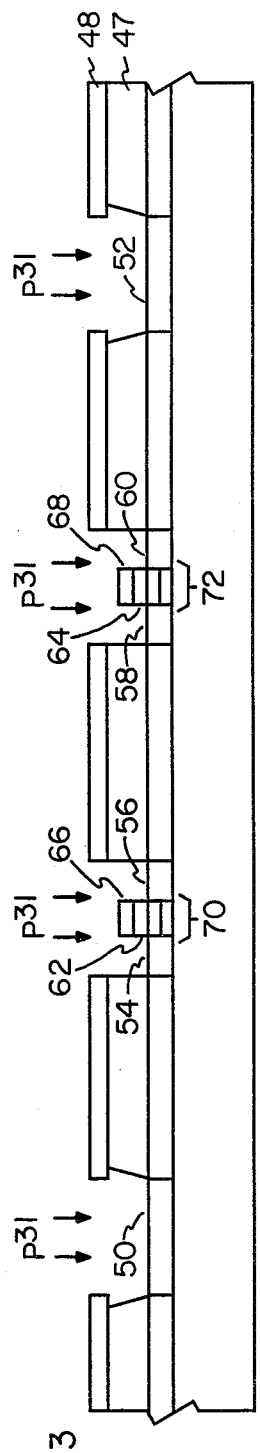
Figure 4:
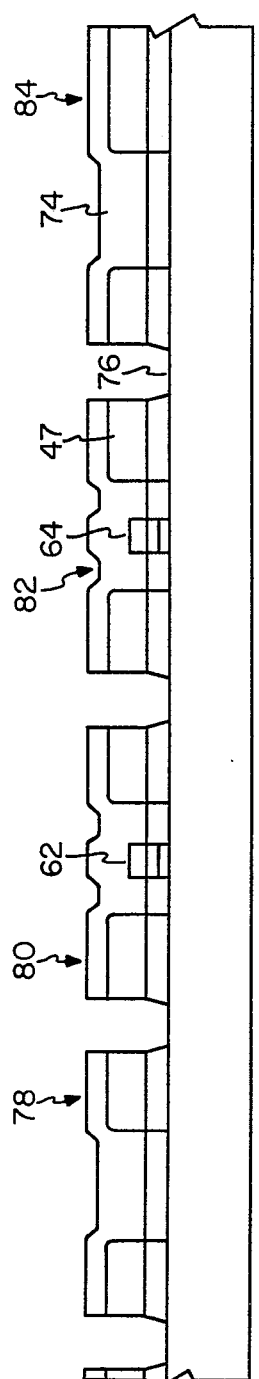

FIGS. 1-12 illustrate schematically the fabrication technique of the present invention. It will be readily appreciated by those skilled in the art that the Figures show a small portion of a silicon-on-sapphire (SOS) wafer and the steps illustrated are performed simultaneously over the entire wafer producing a large number of circuit elements although only a few are illustrated. As shown schematically in FIG. 1, a sapphire substrate 20 having an epitaxial layer 22 of silicon having a thickness in the range of one micron deposited thereon is first covered by pyrolytic deposition with a layer 24 of silicon dioxide ($SiO_2$) approximately 5000 angstroms (Å) thick. The areas of the silicon layer 22 to be implanted with the p-type material are photolithographically defined by application of a mask 26 comprising a positive photoresist layer approximately 1 micrometer thick having openings 28, 30 therein at the location of the desired p-type implant. The $SiO_2$ layer is etched away at the areas 28, 30 defined by mask 26. P-type regions 32, 34 are produced by implanting a material, such as boron $B^{11}$, into the silicon layer 22 by an ion implant technique. The $SiO_2$ layer 24 is undercut in a second etching step to provide areas of deposition 36, 38 wider than the areas 32, 34 of the $B^{11}$ implant, so that the p-type areas 32, 34 are completely covered by n-type areas 36, 38 to provide DC isolation for the p regions. Photoresist layer 26 is removed and n-type material, such as phosphorus, $P^{31}$, or arsenic, $AS^{75}$, is implanted in regions 36, 38 to provide shallow n-type layers 40, 42 overlying the p-type layers 32, 34 as shown in FIG. 2. The above steps provide the device active areas as well as the high value resistor areas within the regions 44, 46 of the silicon layer 28. A key step to formation and accurate control of critical dimensions of the device active area is the intentional undercut of the masking $SiO_2$ layer 24 allowing the active areas to be shaped as desired. The undercut is done with a controlled etch using wet chemical techniques so that the extent of undercut beneath the edges of mask 26 is precisely that intended.

A layer of $SiO_2$ approximately 5000 Å in thickness is deposited by pyrolytic deposition over the surface of the wafer. As shown schematically in FIG. 3, this produces a $SiO_2$ layer 47 approximately 10,000 Å thick over the portions of the wafer from which layer 24 was not previously etched and a layer of $SiO_2$ approximately 5000 Å thick over areas previously implanted. The next areas to be implanted are photolithographically defined by application of a mask 48, and the SiO$_2$ layer is etched away to expose areas 50, 52 not previously doped and the regions 54, 56, 58 and 60 of the previously doped areas. Layers 62, 64 of SiO$_2$ and 66, 68 of the mask remain over areas 70, 72, respectively. Phosphorus P$^{31}$, is applied by an ion implant technique to provide the N+ doping in a higher concentration of dopant than in the regions 40, 42 in the exposed regions 50, 52, 54, 56, 58, 60 of the silicon layer 22. This implant step may be done in two implant steps with the last ion implant done at an ion concentration higher than the concentration used for the other phosphorus implants. This implant allows good ohmic contact to be made to the silicon. Following the ion implant, the photoresist layer 46 is removed. This series of steps simultaneously provides the drain and source areas for the active element, the high value resistor contact areas to the bottom plates of the capacitor elements, and low value resistor areas of the desired integrated circuit.

A photoresist mask 74 is applied over the wafer to define isolated areas of the wafer. A wet chemistry etch removes portions of the SiO$_2$ layer 47 from the wafer, and a CF$_4$ plasma is used to etch the silicon epitaxial layer 22 down to the surface 76 of the sapphire substrate 20, producing electrically isolated islands 78, 80, 82 and 84 as shown schematically in FIG. 4. Electrical isolation of the separate islands 78, 80, 82, 84 is essential to the elimination of leakage currents between adjacent elements of the integrated circuit. Elimination of leakage currents is of key importance for integrated circuit SOS technology.

Figure 5:
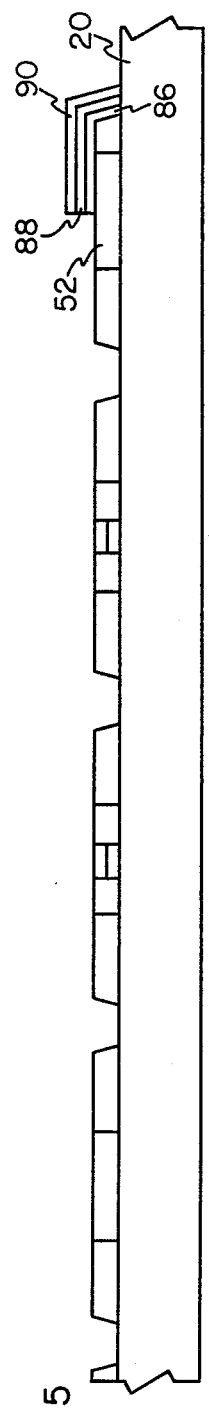

Following creation of the isolated islands, the photoresist mask 74 and SiO$_2$ layers 47, 62 and 64 are removed from the wafer as shown schematically in FIG. 5. Capacitors are then formed, partially overlapping region 52, by the sequential deposition of a layer 86 of SiO$_2$ having a thickness in the range of 1000 Å, a layer 88 of Si$_3$N$_4$ having a thickness in the range of 1000 Å and a layer 90 of polycrystalline silicon having a thickness in the range of 3000 Å. A photoresist mask (not shown) is used to define the dielectric region of each capacitor, and the polycrystalline silicon layer 90 and the Si$_3$N$_4$ layer 88 are sequentially etched to the precise dimensions required for each capacitor plate. The layers 86, 88 and 90 extend over the edge of the island 84 so that no shorting of the capacitor by the metallization for making contact to the capacitor occurs. The SiO$_2$ layer 86 is chemically etched, and the photoresist mask is removed. Polycrystalline silicon is preferred over single crystal silicon for layer 90, since it provides good adhesion to a metal top capacitor plate, to be described later, and contributes to the total capacitance value commensurate with its dielectric constant and thickness.

Figure 6:
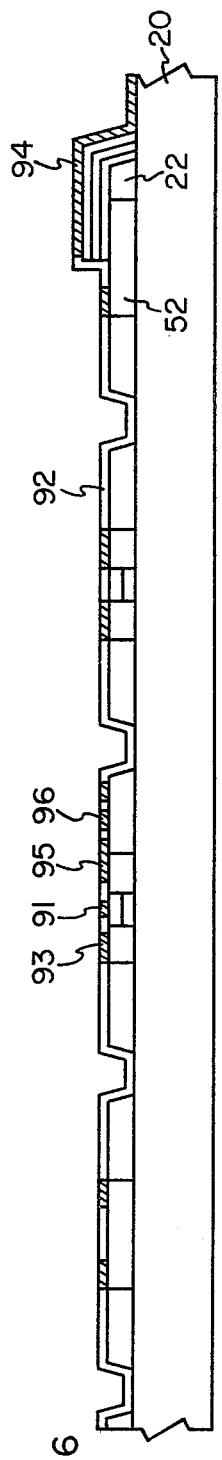

As shown schematically in FIG. 6, a layer 92 of SiO$_2$ approximately 2500 Å thick is deposited over the surface of the wafer, and a photoresist mask (not shown) is placed on the wafer to define the gate 91, source 93 and drain 95 conductor pattern. As SiO$_2$ layer 92 is etched, a lateral etch extending under the photoresist layer is performed in order to facilitate lift-off of the photoresist layer following metallization. Metallization layer 94 is then deposited by a sequence of process steps: back sputter cleaning the area of the wafer to be metallized, and sputter deposition of an approximately 500 Å thick layer of platinum, an approximately 1000 Å thick layer of molybdenum and an approximately 1000 Å thick layer of gold. The deposition of metallization layer 94 covers the entire upper surface of the wafer, and the excess metal not required for electrical connection is lifted off along with the photoresist layer to provide clearly defined metallization patterns over the wafer. The metallization layer 94 provides good ohmic contact to all circuit elements on the wafer, and forms the turns of a spiral inductor, shown schematically at 96. It will be appreciated that the number of turns and the exact shape of the turns will be determined by the design of the mask used, which is based upon the circuit requirements. Metallization layer 94 also forms the necessary Schottky barrier for the active devices on the wafer.

Figure 7:
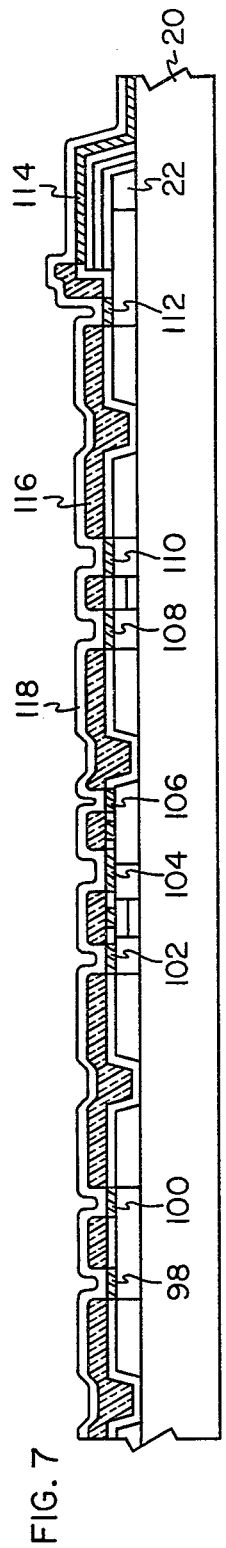
Figure 8:
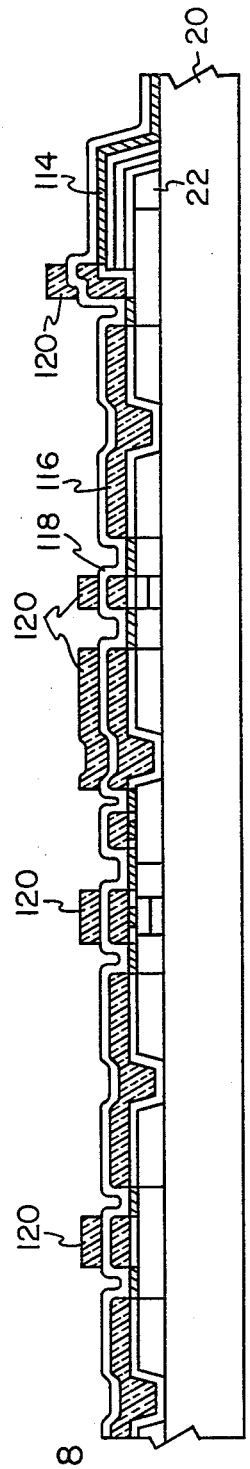
Figure 9:
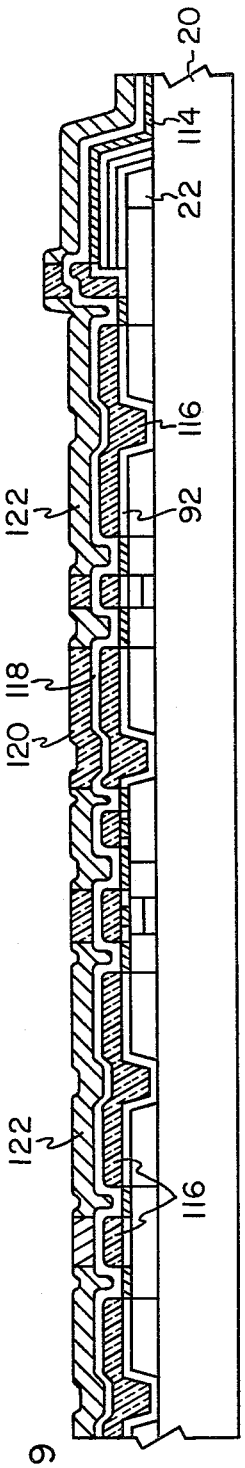
Figure 10:
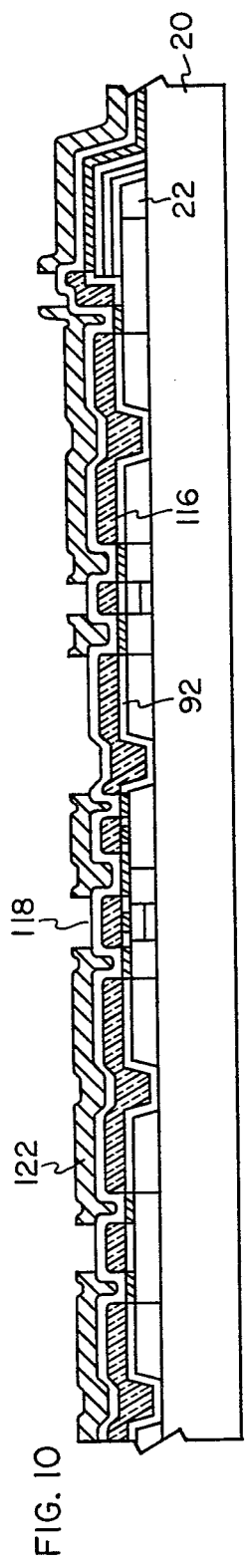

A second metallization layer is applied to form contact areas 98, 100, 102, 104, 106, 108, 110, 112 and capacitor top plate 114 as shown in FIG. 7. A layer 116 of photoresist material approximately 1 μm thick is applied to the wafer to mask the circuit elements and to define the contact areas. A layer 118 of gold approximately 1000 Å thick is then sputter deposited over the entire surface of the wafer. A second layer 120 of photoresist masking is applied as shown in FIG. 8 to define the areas of a third metallization layer and to form air bridges where crossover of one metallization layer by another metallization layer is required. A gold layer 122 approximately 2 μm thick is then electroplated onto the surface of the wafer as shown in FIG. 9. The photoresist layer 120 is then removed leaving the gold layers 118 and 122 exposed as shown in FIG. 10. The electroplated layer 122 of gold decreases the electrical resistance of the metallization and provides physical strength to the air bridges. The use of two photoresist layers 116, 120 provides considerable savings in raw materials compared with other techniques for air bridge formation. The technique is fast, easy and well suited for mass production. It also provides two layers of interconnected metallization, which facilitates completion of circuit connections for large scale integrated circuits.

Figure 11:
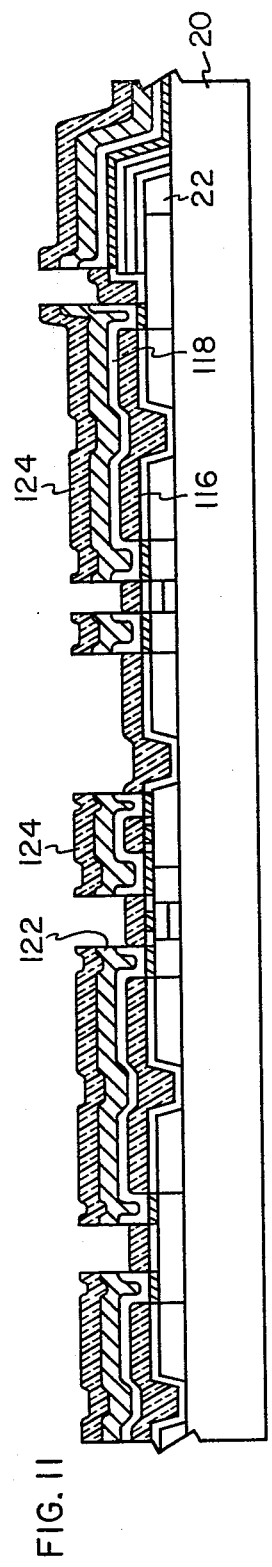
Figure 12:
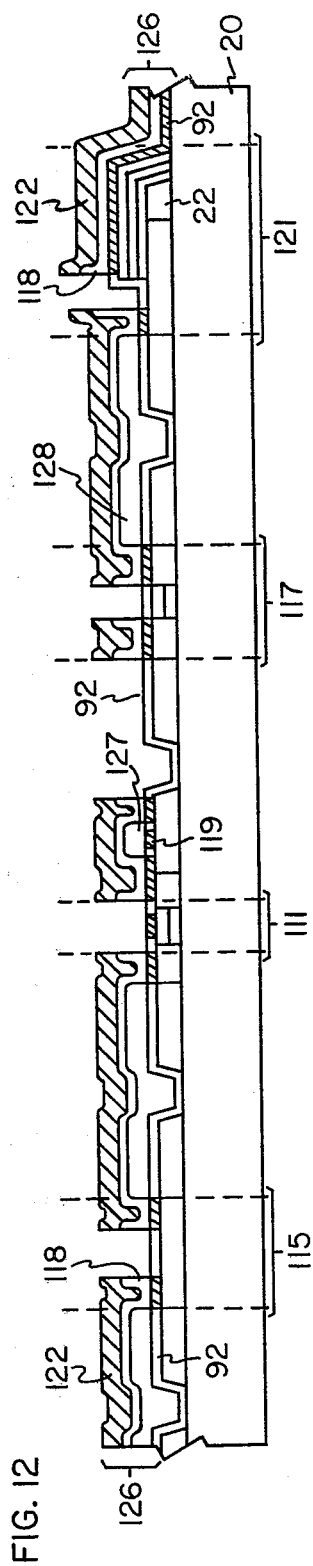

The electroplated gold layer 122 is masked by a photoresist layer 124 and portions of gold layer 118 are etched away, as shown in FIG. 11. Then all photoresist layers are removed producing the metallization pattern shown in FIG. 12 in which metallization layers 118 and 122 are merged into a single thick layer 126 providing air bridges 127, 128. The application of mask layer 124 may be omitted, but its presence during the etching process protects the surface of gold layer 126 from damage caused by exposure to the etchant. The protected gold layer 126 is a better conductor at microwave frequencies. This technique allows the use of SOS material and technology for the production of monolithic microwave integrated circuits allowing the production of completely isolated elements on a single wafer. Active elements such as transistor 111, and passive elements such as low value resistor 115, high value resistor 117, inductor 119 and capacitor 121 can be simultaneously formed, thereby saving process time, as compared to the prior art techniques which required separate fabrication and interconnection of the devices.

The number of masks applied and the number of dopant implanting steps will, of course, be determined by the specific integrated circuit to be fabricated. The present invention provides a technique for efficiently forming passive and active circuit elements simultaneously, and the configuration of each photoresist mask used will determine the pattern of implant produced. The metallization patterns also will be determined by the interconnection pattern required for a particular integrated circuit. The present technique allows great versatility in circuit design and modification, so that a great variety of integrated circuits can be made using the technique described herein.

Figure 13:
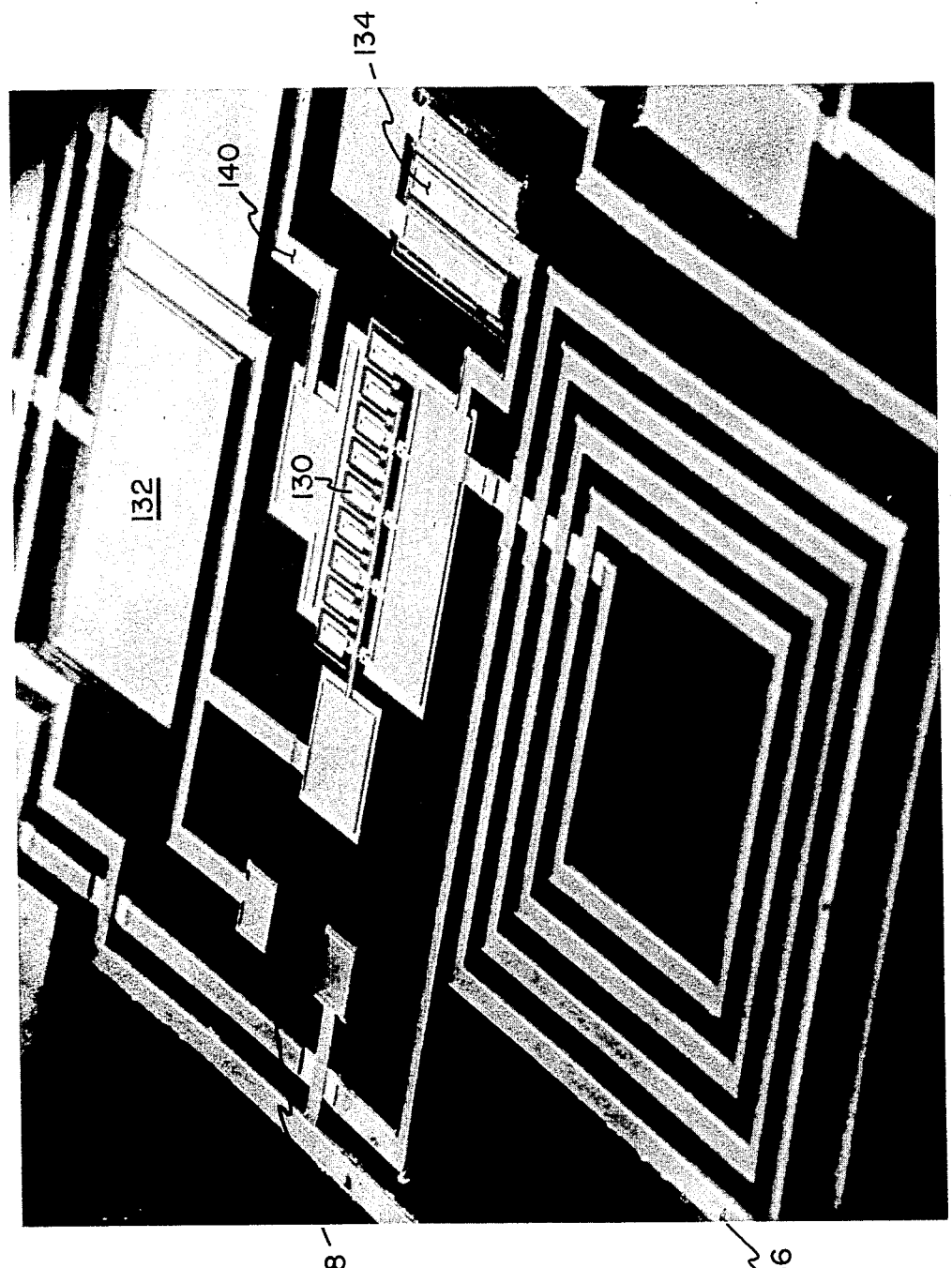
FIG. 13 is a scanning electron microscope view of a section of a circuit constructed according to the present invention.

FIG. 13 is a partial plan view of a monolithic microwave integrated circuit manufactured according to the present invention. MESFET 130 is surrounded by capacitors 132, 134, inductors 136 and resistor 138. One of the key features of the present invention is the capability to form, in the same processing step, passive circuit elements, such as the inductor 136, along with the device interconnecting metal 140 for the active elements of the integrated circuit. In the implanting of boron, $B^{11}$ was implanted within the silicon layer at a dosage of $5 \times 10^{11}$ atoms per square centimeter at an energy of 175 KeV. The boron implant serves to keep electron flow near the surface of the implant when the integrated circuit is in use. The first channel phosphorus implant was $P^{31}$ at a dosage of $4 \times 10^{12}$ atoms/cm$^2$ at 100 KeV. The second channel implant was $P^{31}$ at $1 \times 10^{15}$ atoms/cm$^2$ at 100 KeV followed by a third implant of $P^{31}$ at $1 \times 10^{16}$ atoms/cm$^2$ at 30 KeV. The third $P^{31}$ implant provides good ohmic contact to the semiconductor material. These dosage and energy levels can be selected to provide the necessary doping for a particular desired circuit.

Figure 14:
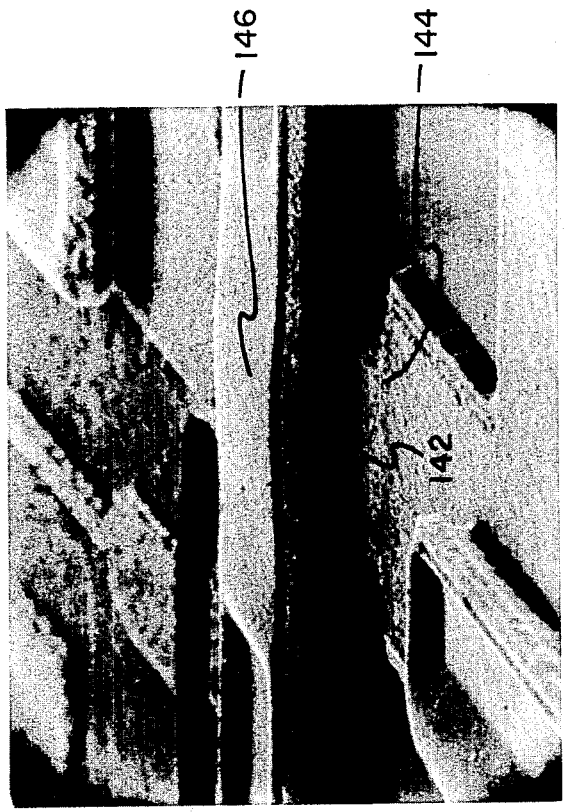
FIG. 14 is a scanning electron microscope view of an air-gap crossover between metallization layers as made by the present invention.

FIG. 14 shows a greatly enlarged scanning electron microscope view of an air-gap bridge 142 separating two layers 144, 146 of metallization made according to the present invention. The ability to provide multiple layers of metallization isolated by an air gap enables the overlap of connection and/or inductor layers without electrical shorting. This greatly facilitates circuit design.

Figure 15:
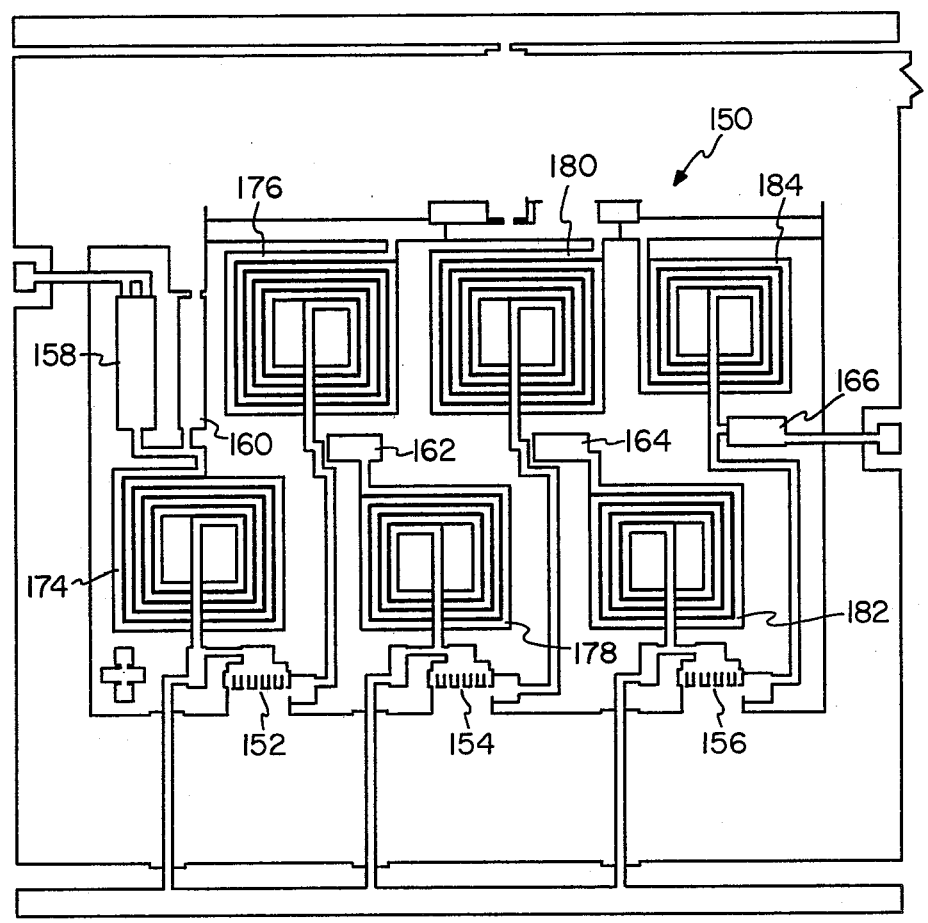
FIG. 15 is a schematic plan view of a three-stage monolithic low noise amplifier built according to the present invention.
Figure 16:
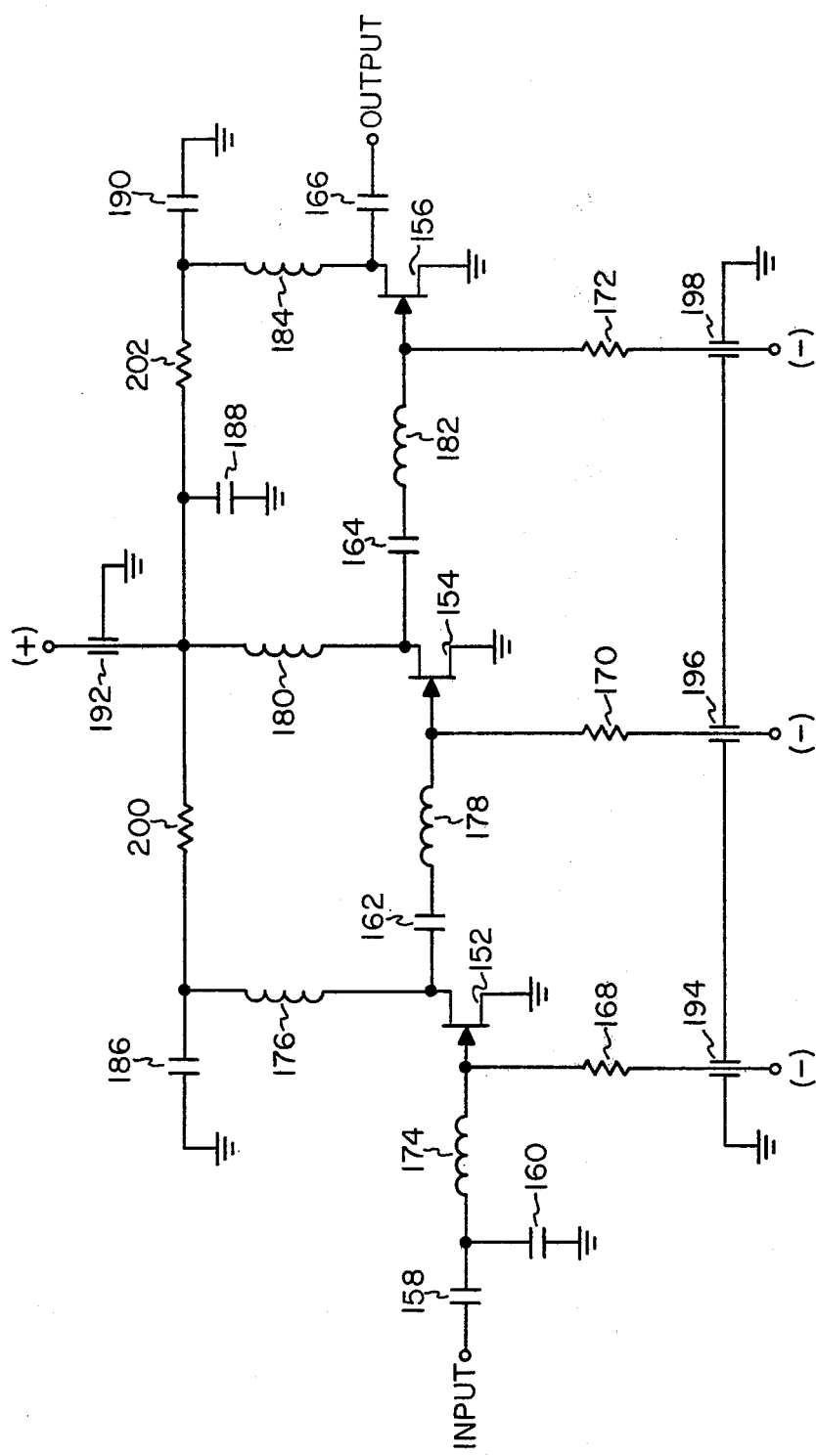
FIG. 16 is a circuit diagram for the integrated circuit shown in FIG. 15.

FIG. 15 is a top view of an integrated circuit three-stage monolithic low noise amplifier fabricated according to the present invention. FIG. 16 is a circuit diagram for the amplifier shown in FIG. 15. The amplifier 150 uses 400 micron gate width MESFETS 152, 154, 156 in a common source configuration. The 400 micron MESFET was selected in order to lower the source series resistance, which reduces thermal and uncorrelated noise, and to increase the amplifier dynamic range. Capacitors 158, 160, 162, 164 and 166 are formed in the multilayer technique described above. Resistors 168, 170, 172 were formed in the first boron implant technique. Spiral inductors 174, 176, 178, 180, 182 and 184 were fabricated by the metallization steps described hereinabove. Capacitors 186, 188, 190, 192, 194, 196 and 198 represent integrated by-pass filtering capacitances, and resistors 200 and 202 represent filtering resistors to provide RF stage isolation. Circuit element losses are not shown. These losses are kept at a minimum by the present fabrication technique and may be accounted for by analysis. The circuit 150 has good gain and 3 db bandwidth performance characteristics and takes advantage of the isolation feature of the SOS structure.

The present invention allows the use of silicon-on-sapphire technology and processing for high performance integrated circuits. A wide range of integrated circuits may be manufactured using teachings in the instant invention, including monolithic phase shifters, power amplifiers and transmit-receive switches for radar system application with the sequence of steps and mask configuration modified as required to produce the desired circuit.

We claim:

1. A method of fabricating monolithic microwave integrated circuits comprising the steps of:
   (a) simultaneously forming upon a wafer comprising a layer of silicon disposed upon a major surface of a sapphire substrate, a plurality of active, field effect transistor circuit elements and a plurality of passive circuit elements with said layer of silicon; said step further comprising:
      (1) forming a circuit element defining photoresist mask upon the surface of said wafer, said mask having openings therethrough to define the implant areas of predetermined active and passive circuit elements at exposed areas of said surface of said wafer;
      (2) implanting a dopant of a particular electrical conductivity type and at a particular doping density into said exposed areas;
      (3) removing said photoresist mask; and
      (4) repeating steps (1), (2) and (3) for each desired implant of a particular desired dopant;
   (b) removing selected portions of said layer of silicon to produce a plurality of electrically isolated islands containing at least one circuit element; and
   (c) depositing a plurality of metallization layers upon said wafer in a predetermined pattern to simultaneously form inductive circuit elements and circuit interconnections for said integrated circuit.

2. The method of claim 1 wherein step (b) comprises:
   (1) forming an island defining photoresist mask for defining electrically isolated islands upon said surface of said wafer, said island defining photoresist mask providing a means for protecting the active and passive elements of said integrated circuit; and said island defining mask having openings therethrough defining spaces between selected ones of said active and passive circuit elements;
   (2) etching through said layer of silicon to said major surface of said sapphire substrate in said spaces between selected ones of said active and passive circuit elements; and
   (3) removing said island defining photoresist mask.

3. The method of claim 2 further comprising the steps of
   (1) depositing at predetermined areas of selected ones of said islands a layer of $SiO_2$, a layer of $Si_3N_4$ and a layer of polycrystalline silicon to provide capacitive elements for said integrated circuit; and
   (2) etching said layers of said capacitive elements to a desired shape.

4. The method of claim 3 wherein step (c) comprises:
   (1) depositing a first metallization layer upon said wafer in a predetermined pattern including a pattern for inductive elements for said integrated circuit, electrical contacts to selected ones of said plurality of active elements and electrical contacts to selected ones of said plurality of passive circuit elements;
   (2) forming a layer of insulating material over said wafer covering selected areas of said first layer of metallization;
   (3) depositing a second layer of metallization upon said wafer in a predetermined pattern including electrical interconnections for selected ones of said plurality of active circuit elements and electrical interconnections for selected ones of said plurality of passive circuit elements, (4) depositing a third layer of metallization contiguous with said second layer of metallization; and (5) removing said layer of insulating material to leave air bridges separating said first layer of metallization from said second layer of metallization at predetermined locations of said metallization layers.

5. A method of fabricating monolithic microwave integrated circuits comprising the steps of:
   (a) forming within a layer of silicon disposed upon one major surface of a sapphire substrate a plurality of layers of doped silicon at a first plurality of spaced regions of said layer of silicon; alternate ones of said plurality of layers being of alternate conductivity types; said step further comprising:
      (1) forming a layer of $SiO_2$ on the surface of said layer of silicon,
      (2) applying a first photoresist mask upon the surface of said $SiO_2$ layer, said first photoresist mask having spaced openings therethrough at predetermined locations;
      (3) removing said $SiO_2$ layer in the areas defined by said openings in said first predetermined mask to expose the silicon in said areas;
      (4) implanting a first dopant of said first type conductivity into said silicon in said areas defined by said mask;
      (5) undercutting said layer of photoresist material by removing a portion of said $SiO_2$ layer adjacent each said opening in said mask extending about the periphery thereof to expose an area of said silicon larger than the area of each said opening;
      (6) implanting a second dopant of a conductivity type opposite that of said first type to form a layer of said opposite type conductivity overlying a layer of said first conductivity material; and
      (7) removing said first photoresist mask;
   (b) forming within said layer of silicon a second plurality of spaced doped regions; each of said second plurality of doped regions comprising regions of a single conductivity type material spaced from respective ones of said first plurality of regions;
   (c) removing portions of said layer of silicon from said substrate so that each said region of said first plurality of regions and each said region of said second plurality of regions forms an electrically isolated island of silicon on said substrate;
   (d) depositing upon said surface of selected ones of said second plurality of regions of a single conductivity type, a layer of electric insulating material and a plurality of layers of semiconductor material overlying said layer of insulating material;
   (e) depositing upon selected areas of each of said islands a first layer of metallization; said first layer of metallization inductors upon predetermined areas of predetermined ones of said islands and forming electrical contacts to predetermined areas of said first plurality of regions and to predetermined areas of said second plurality of regions;
   (f) depositing a second layer of metallization upon selected areas of said first metallization layer to form electrical connection between selected ones of said selected areas of said first metallization layer; and
   (g) depositing a third layer of metallization covering said second metallization layer.

6. The method of claim 5 wherein step (b) comprises:
   (1) forming a second layer of $SiO_2$ upon the surface of said wafer;
   (2) forming a second photoresist mask upon said wafer; said second mask having spaced openings therethrough at predetermined locations;
   (3) removing said second and said first $SiO_2$ layers in the areas defined by said openings in said second photoresist mask to expose the silicon in said areas;
   (4) implanting a third dopant of said opposite type conductivity having a doping density higher than the doping density of said dopant of said opposite type conductivity deposited in step (a); and
   (5) removing said second photoresist mask.

7. The method of claim 6 wherein the step of implanting a third dopant comprises:
   (1) implanting a first dosage of said third dopant at a first doping density; and
   (2) implanting a second dosage of said third dopant at a second doping density higher than said first doping density.

8. The method of claim 7 wherein step (c) comprises:
   (1) forming a third photoresist mask upon the surface of the wafer, said third mask having spaced openings therethrough defining spaces between each region of said first and second pluralities of regions,
   (2) etching through the $SiO_2$ layers in the areas of the openings in said third mask;
   (3) etching through said silicon to the surface of said sapphire substrate;
   (4) removing said third mask; and
   (5) removing all $SiO_2$ layers from said wafer.

9. The method of claim 8 wherein step (d) comprises:
   (1) forming at predetermined areas of said selected ones of said second plurality of regions of a single conductivity type a layer of $SiO_2$ of limited extent;
   (2) depositing over said layer of $SiO_2$ of limited extent a layer of $Si_3N_4$;
   (3) depositing over said layer of $Si_3N_4$ a polycrystalline silicon layer;
   (4) depositing a fourth photoresist mask having spaced openings therethrough to defined spaced capacitor areas disposed in partially overlapping relationship with said selected ones of said regions of a single conductivity type;
   (5) plasma etching away the polycrystalline silicon layer and the $Si_3N_4$ layer in the areas exposed by said fourth mask; and
   (6) removing said fourth mask.

10. The method of claim 9 wherein step (d) comprises:
   (1) forming a layer of $SiO_2$ over the surface of said wafer;
   (2) forming a fifth photoresist mask having spaced openings therethrough defining active device gate metal areas, a pattern of inductors for the circuit, top plates of capacitors, contacts to resistive elements, contacts to the bottom areas of capacitors and source and drain contacts of the active elements of said circuit upon the surface of said wafer;
   (3) etching through said $SiO_2$ layer in said exposed areas;
   (4) sputter depositing in sequence a layer of platinum metal, a layer of molybdenum metal, and a first layer of gold metal; and
   (5) lifting off from said wafer said fifth mask, thereby removing the portions of the sputter deposited metal layers which cover the mask and leaving those portions of said sputter deposited metal layers making contact with said wafer at the areas of the openings in said fifth mask.

11. The method of claim 10 wherein step (f) comprises:
 (1) forming a sixth photoresist mask having spaced openings therethrough defining contact areas for said inductors, top plates of said capacitors, contacts for said resistors and said capacitors, contacts to said drain and source regions of said active circuit elements, and circuit interconnects; and
 (2) sputter depositing a second layer of gold metal over said wafer.

12. The method of claim 11 wherein (g) comprises:
 (1) forming a seventh photoresist mask upon the surface of said wafer having spaced openings therethrough defining contact areas for said inductors, top plates of said capacitors, contacts for said resistors and said capacitors, contacts to said drain and source regions of said active circuit elements, circuit interconnects, and air bridges for metallization crossovers;
 (2) electroplating a third layer of gold metal over the surface of said wafer; and
 (3) removing said seventh photoresist mask.

13. The method of claim 12 further comprising:
 (1) forming an eighth photoresist mask over the areas of said wafer covered by said electroplated third layer of gold metal; said eighth photoresist mask having spaced openings therethrough defining areas of said wafer surface from which metallization is to be removed;
 (2) etching through said second layer of gold metal at the openings through said eighth photoresist mask; and
 (3) removing said eighth photoresist mask and said sixth photoresist mask.

14. The method of claim 13 wherein
each of said photoresist masks comprises a layer of positive photoresist material having a thickness in the range of 5000 Å.

15. The method of claim 14 wherein:
said first dopant comprises the boron isotope $B^{11}$; and
said second and third dopants comprise the phosphorus isotope $P^{31}$.

16. The method of claim 14 wherein:
said first dopant comprises the boron isotope $B^{11}$; and
said second and third dopants comprise the arsenic isotope $As^{75}$.

17. The method of claim 9 wherein
said layer of $SiO_2$ of limited extent has a thickness in the range of 1000 Å;
said layer of $Si_3N_4$ has a thickness in the range of 1000 Å; and
said layer of polycrystalline silicon has a thickness in the range of 3000 Å.

18. The method of claim 10 wherein:
said layer of platinum metal has a thickness in the range of 500 Å;
said layer of molybdenum metal has a thickness in the range of 1000 Å; and
said first layer of gold metal has a thickness in the range of 1000 Å.

19. The method of claim 11 wherein said second layer of gold metal has a thickness in the range of 1000 Å.

20. The method of claim 12 wherein said third layer of gold metal has a thickness in the range of 2 μm.

* * * * *